United States Patent [19]

Dixon

[11] 3,958,161

[45] May 18, 1976

[54] METHOD OF CONTROLLING THE POLARIZATION CONDITION OF TRANSDUCERS

[75] Inventor: Norman E. Dixon, Pasco, Wash.

[73] Assignee: Battelle Development Corporation, Columbus, Ohio

[22] Filed: Mar. 12, 1973

[21] Appl. No.: 340,190

[52] U.S. Cl. .......................... 317/262 F; 29/25.35; 310/8; 310/8.1; 310/8.5; 310/9.5
[51] Int. Cl.² .................. H01L 41/18; B01J 17/00
[58] Field of Search .............. 310/8.1, 8.5, 8, 9.7, 310/9.8, 9.5, 8.9; 317/262 F; 29/25.35

[56] References Cited
UNITED STATES PATENTS

| | | | |
|---|---|---|---|
| 2,505,370 | 4/1950 | Sykes | 310/8.9 |
| 2,624,853 | 1/1953 | Page | 310/8.5 |
| 2,659,829 | 11/1953 | Baerwald | 310/8.5 |
| 2,765,765 | 10/1956 | Bigler et al. | 310/8.9 X |
| 2,808,523 | 10/1957 | Holmbeck | 310/8.9 X |
| 2,816,239 | 12/1957 | Berge | 310/8.9 X |
| 3,447,217 | 6/1969 | Kumada | 29/25.35 |
| 3,448,348 | 6/1969 | Stadler | 317/262 F |
| 3,766,616 | 10/1973 | Staudte | 310/8.2 X |
| 3,777,192 | 12/1973 | Barrow | 310/8.2 X |

Primary Examiner—Mark O. Budd
Attorney, Agent, or Firm—Christensen, O'Connor, Garrison & Havelka

[57] ABSTRACT

A method for control monitoring the phase, depth, and area polarization of a piezoelectric transducer element. A piezoelectric element is energized by electrical pulses of controlled amplitude, duration, and repetition rate, and the response of the element is recorded by an oscilloscope or other suitable device. By properly matching the configuration, duration, and repetition rate of the driving pulses, with respect to the desired depth and phase of individual element layers, controlled-phase controlled-volume transducers may be achieved with a single piezoelectric transducer element.

13 Claims, 10 Drawing Figures

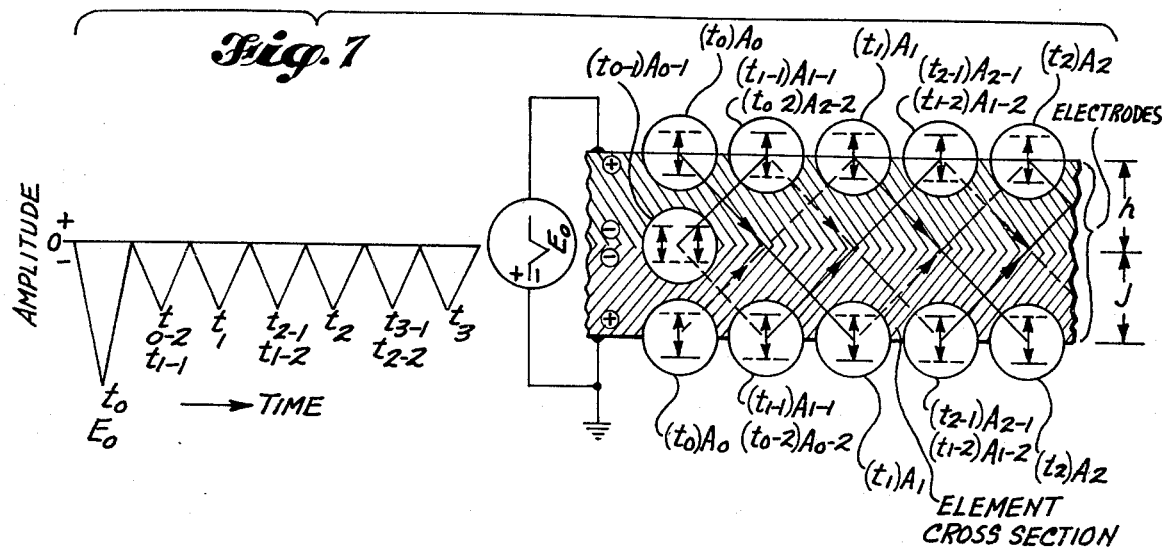
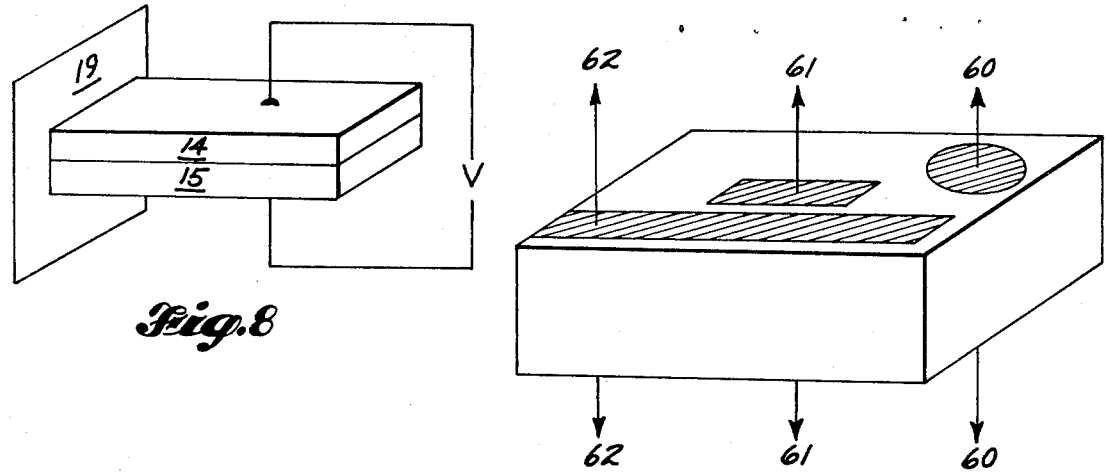
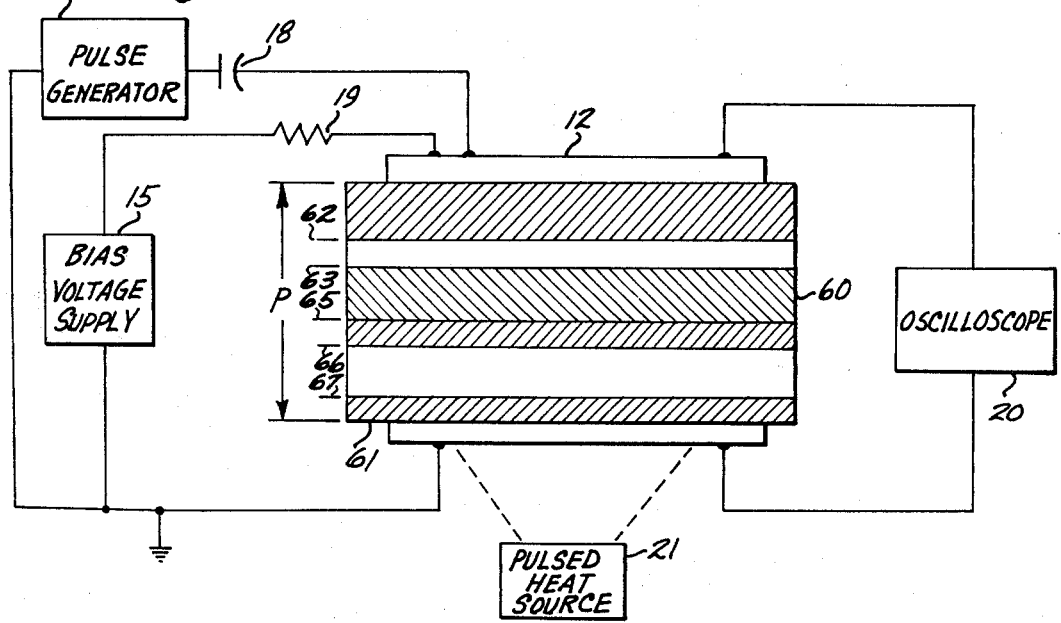

METHOD OF CONTROLLING THE POLARIZATION CONDITION OF TRANSDUCERS

BACKGROUND OF THE INVENTION

This invention relates generally to piezoelectric transducers, and more specifically, to a method for control monitoring the polarization and volume of discrete layers in a piezoelectric transducer element.

Heretofore, nearly all of the transducer elements which must be artificially polarized to produce a piezoelectric effect have been uniformly polarized in the thickness or lateral dimension of the element. Conventional transducers of this artificially polarized category, i.e., ferroelectric ceramic materials such as barium titanate or lead zirconate—lead titanate or lead metaniobate, are polarized completely or uniformly through the element in a direction parallel with the applied polarizing potential or bias voltage.

Polarization of such ferroelectric ceramics refers to the physical condition of the crystals of the material such that its magnetic dipoles are aligned in a given direction. A material may thus be polarized in one of two different directions, i.e., the magnetic dipoles of the material may be aligned in one of two opposing directions, or the material may be unpolarized, a condition wherein the dipoles are arranged in random directions with respect to one another.

Theoretically, polarization of such a material is accomplished by applying a strong electric field to the material, and coincidentally heating it to a temperature above its Curie point. When the material is heated above its Curie temperature, it loses its ferroelectric properties, and the electric field aligns the magnetic dipoles of the material to the direction of the applied field. Practically, however, the material is heated to a temperature slightly below its Curie point, during which time a strong electric field is applied to the material. The material is thus allowed to polarize over an extended period of time. With the electric field still applied to the material, it is slowly cooled to an ambient temperature. When the external field is then removed, a remnant polarization is retained in the material and the ferroelectric ceramic now will typically respond in a manner similar to that of other natural piezoelectric materials such as Rochelle salt or ammonium phosphate crystals.

The effect which the polarized ceramic exhibits is known as the piezoelectric effect, which refers to the material's capability of mechanically deforming in response to an applied electrical signal, and conversely, or storing an electric charge in response to a mechanical or acoustical excitation. By placing electrodes on opposing surfaces of the element, this stored charge may be released in the form of an electrical current, the value of which is a function of the applied mechanical or acoustical force. The polarized ferroelectric element, which exhibits this piezoelectric characteristic, is thus a true transducer, a device capable of converting or transforming directly between various forms of energy, in this case between mechanical or acoustical energy, and electrical energy.

Conventional transducers made from such polarized ferroelectric materials, however, have several distinct limitations, one of the most important being their incapability of producing a broadband response to excitation. For instance, all piezoelectric transducers have natural resonant frequencies, wherein the transducer element vibrates in a ringing fashion after it is struck with wave energy of a certain frequency. A conventional fully polarized transducer has both a natural mechanical resonant frequency, and at least one natural electrical frequency of resonance. The period of this natural resonant frequency will equal to twice the velocity of the wave striking the element times the thickness of the element. If the element is excited by a one-quarter wave length or greater signal with respect to its period, the transducer will tend to ring, producing an undesirable output. This ringing response of a particular transducer will inherently limit the frequency range of adequate response to mechanical or electrical signals applied to it. Thus, the effective response frequency range of a conventional piezoelectric transducer is limited to those excitation frequencies which do not cause the transducer to respond in a ringing fashion. The conventional piezoelectric transducer is thus a narrow band transducer, and often rather limited in application.

Another significant limitation of current transducer technology is the inability to produce homogeneous transducer elements which may be partially polarized in their thickness direction, such that multiple layers of different phase, area, and depth of polarization may be achieved. For instance, it may be desirable to have bimorph or multimorph transducers which are comprised of multiple layers, each layer having a particular polarization in one direction or another, or alternatively being unpolarized. FIG. 8 shows a stacking of two such elements 14 and 15, the two elements being mounted on a stationary wall 19 and oppositely polarized. The application of a voltage to this configuration will cause the device to bend in one direction or the other, depending on the polarity of the voltage. This configuration is known in the art as a bender transducer. Other configurations or additional layers may be used to accomplish other results, such as high voltage generators.

Prior art transducer technology accomplishes this multimorph transducer structure by utilizing several distinct elements, polarizing them completely in one direction or another or maintaining them unpolarized, and then combining them in discrete layers and areas, as necessary to perform the desired function. This technique, of course, results in distinct interfaces between adjoining layers, and the inherent impedance mismatch at the layer interfaces often can create significant difficulties with respect to the desired response.

These disadvantages have been largely overcome by a method for controlling the phase, area and depth of polarization in a single piezoelectric element, a method which is more fully disclosed in copending application entitled "Method of Producing Transducers with Phase, Area, and Depth Controlled Polarization," by Norman F. Dixon and William D. Jolly and assigned to the assignee of the present invention.

To exercise control over specific transducer configurations, with respect to the phase, depth and area of selected element layers, as made possible by the technique of the copending application referred to above, the element itself must be monitored, preferably real time, during the fabrication of the multi-layered transducer. Such a method of monitoring, as disclosed and claimed in the present application, permits accurate control over the physical dimensions of individual polarized or unpolarized layers within a single transducer element, as well as an accurate indication of their state of polarization.

In view of the above, it is a general object of the present invention to provide a reliable method of monitoring polarization of piezoelectric transducers.

It is another object of the present invention to provide a method of polarization monitoring which is useful with respect to varying depths and areas of polarization in a single transducer element.

It is a further object of the present invention to provide a method of monitoring which can control the fabrication of multi-layered transducer elements in real time.

SUMMARY OF THE INVENTION

In accordance with the above, the method of the present invention generally includes the steps of initially generating at least one energy pulse and applying it to the transducer element. The response of the transducer to the applied pulse is then sensed by a suitable apparatus, and the response is then compared with a predetermined response pattern to determine whether the desired phase and depth of polarization have been achieved. This occurs for successive layers of polarization in a multi-layer transducer element, such that the phase and depth of polarization of the successive layers may be accurately known, and varied, if desired.

DESCRIPTION OF THE DRAWINGS

A more thorough understanding of the invention may be obtained by a study of the following detailed description taken in conjunction with the accompanying drawings in which:

FIG. 7 shows the response of a double surfaced polarized transducer element to a single electrical triangle wave excitation signal, and the excitation period is less than or equal to the polarized layer periods.

FIG. 8 shows a bimorph structure of the prior art known as a bender transducer.

FIG. 9 shows a transducer element produced in accordance with the principles of the present invention multiple layers of polarization and nonpolarization in a single transducer element.

FIG. 10 shows a particular transducer area configuration.

DESCRIPTION OF THE PREFERRED EMBODIMENT

Figure 1:
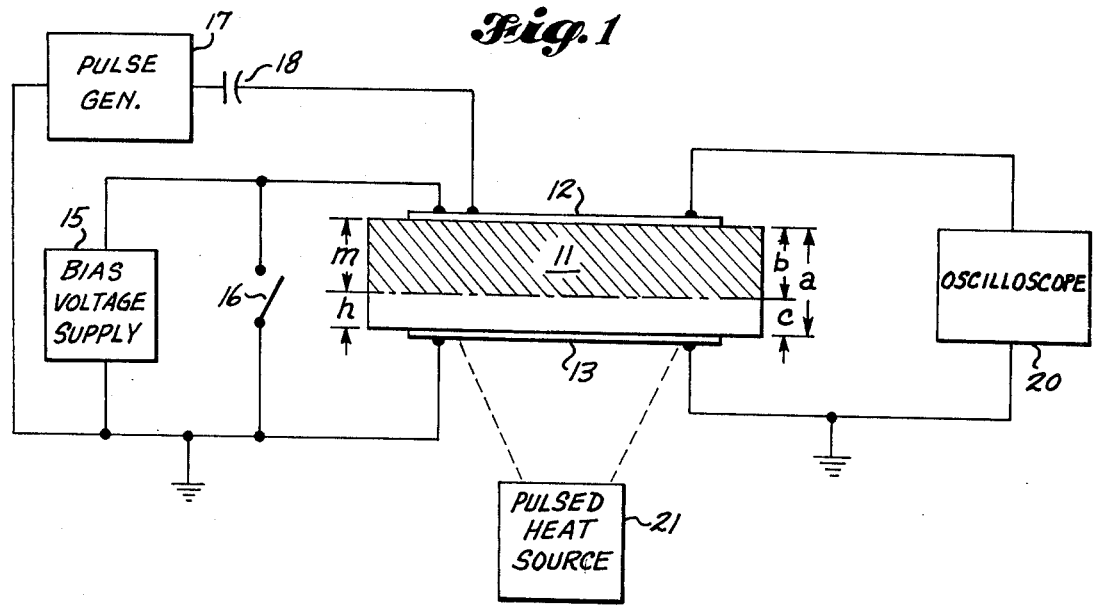
FIG. 1 shows the physical connection and apparatus necessary for accomplishing the steps of the present invention relative to a simple polarized-nonpolarized configuration of a transducer element.

Referring to FIG. 1, a general system for controlling the partial polarization of a piezoelectric transducer element is shown, in conjunction with apparatus for monitoring the partial polarization. Furthermore, the apparatus shown in FIG. 1 serves to demonstrate the technique by which multiple layers of controlled depth, controlled area, and controlled phase polarization in a single homogeneous ferroelectric element are produced, and accurately monitored. The method of partial polarization, as covered more fully in the copending application referred to above, will first be explained, so as to clarify the monitoring technique of the present invention. Referring to FIG. 1, a ferroelectric ceramic element 11 is shown, having electrodes 12 and 13 connected to opposing faces in the thickness direction. For the purposes of explanation, the portion of the element 11 which is polarized in a given direction is shown by diagonal lines, and the portion of the element which is not polarized is shown by an absence of lining. Opposing diagonal lines indicate polarization in an opposite direction. The configuration shown in FIG. 1 represents the polarization state of the element after the technique to be described in the following paragraphs has been accomplished.

To accomplish partial polarization, a bias voltage supply 15 is connected across the two electrodes 12 and 13, which are attached to opposing surfaces of the element 11, and a switch 16 is provided to short the electrodes to ground. A pulse generator 17 in conjunction with a capacitor 18 and an oscilloscope 20 are also connected between the electrodes 12 and 13, for purposes of monitoring the depth of the effect of the pulsed heat source 21.

According to a first technique for partial polarization, the ferroelectric element 11 is first completely polarized in the thickness dimension a, so that its magnetic dipoles are arranged in one direction. This complete polarization in a given direction is accomplished in a well-known fashion by applying a strong electrical field of given polarity, heating the element to a given temperature below its Curie temperature, and allowing the material to slowly polarize, as explained earlier. The element is then slowly cooled to an ambient temperature while the electrical field is maintained, resulting a completely polarized element in a given direction.

The electrodes 12 and 13 are then shorted together by use of the switch 16, which, when closed, places both electrodes at a common ground potential. The pulsed heat source 21 is then actuated. The heat source is concentrated such that a selected portion of the near surface of the transducer element is heated above the element's Curie temperature, hence destroying the polarization of the affected area. The area of depolarization, as well as the depth of depolarization, may be accurately controlled by controlling the magnitude, duration, and repetition rate of the heat pulses. As shown in FIG. 1, this results in a transducer element having a layer or strip of unpolarized material of dimension $c$ at one surface of the element, the strip having an internal interface with a polarized layer of dimension $b$. The relative dimensions of $b$ and $c$ may be accurately controlled by the application of heat pulses as described above. This is one technique of varying the polarization condition of a single homogeneous transducer element in a given dimension between two generally opposing surfaces.

A second technique for creating partially polarized transducer elements utilizes a pulsed heat source to partially polarize an otherwise unpolarized element. Referring again to FIG. 1, the transducer element 11 is first completely depolarized in the a dimension. Electrodes 12 and 13 are again attached to the transducer element 11, and a bias voltage supply 15 is connected to the element through the electrodes. Pulse generator 17, capacitor 18, and oscilloscope 20 are utilized to monitor the depth of polarization achieved by the thermal pulses on the otherwise unpolarized element according to the principles of the present invention.

A polarization voltage bias, which determines the phase of the polarization, in accordance with standard polarization theory, is maintained on the element 11 via the voltage supply 15 through the electrodes 12 and 13. Thermal pulses are then applied to the unpolarized element 11 by means of pulsed heat source 21, as shown in FIG. 1, resulting in a polarized layer of dimension $n$, in the otherwise unpolarized element of dimension $m$. The thermal pulses are again controlled, in terms magnitude, duration, and repetition rate, such that a varying depth of the element is heated above or close to the element's Curie temperature, and in combination with the voltage bias on the surfaces results in a polarized layer of a given polarization, depending on the polarity of the bias voltage.

Since at some depth the temperature effect of the heating decays significantly below that of the Curie temperature of the element, the depth of polarization may be controlled by controlling the thermal pulses. For instance, a 4 mil depth of polarization may be obtained in lead zirconate-lead titanate ferroelectric material with a total of 10 heat pulses 1 minute apart, each pulse being 2 to 3 microseconds in duration, with a magnitude of two joules of energy.

By varying the amount of energy contained in the pulses, as well as the duration of the pulses, and the interval between the pulses, the depth of a given polarization with respect to the cross-sectional dimension of an otherwise unpolarized, or oppositely polarized, element may be accurately controlled.

Referring to FIG. 9, a multimorph, or multilayer, transducer is shown which takes advantage of both of the techniques explained above, resulting in a structure which has multiple layers of polarization in a given direction of a transducer element, the depth, area, and phase of the polarization of the individual layers being accurately controlled by the pulsed heating and monitoring techniques of the present invention. This eliminates the need for multiple separate polarized or unpolarized layers which are then sandwiched together in some fashion to form a discrete whole transducer. Rather, the multipolarized transducer is produced from a single homogeneous transducer element, thereby eliminating the inherent impedance matching problems of the prior art due to discrete interfaces between differently polarized or nonpolarized regions.

Referring to FIG. 9, the transducer element shown generally at 60 may be initially completely polarized in a given direction, to a depth of dimension p. Thereafter, the portion of the transducer from surface 61 to boundary 62 may be depolarized by grounding the electrode connections as shown in FIG. 1 and applying sufficient heat. Alternatively, FIG. 9 shows the use of a resistor 19, which accomplishes the same result as the closed switch 16 when the bias supply 15 is off, by establishing a closed circuit to ground from electrode 12. The depth of depolarization is monitored by the monitoring technique of the present invention to be later described. At this point, a specified bias is applied to the electrodes, and heating applied again, to an extent that the portion of the element from surface 61 to boundary 63 will be polarized in a direction opposite to that of the first polarization.

At this point, the bias is reversed, and heat again applied, resulting in a first phase polarization form surface 61 to boundary 65.

The element surfaces are then placed at ground potential either via a switch or by the circuit shown in FIG. 9, and the surface 61 again selectively heated to a depth such that from surface 61 to boundary 66, the element is unpolarized. A bias is then applied to the electrodes and heat applied such that the portion of the element from surface 61 to boundary 66, the element is unpolarized. A bias is then applied to the electrodes and heat applied such that the portion of the element from surface 61 to boundary 67 is polarized, as shown. This results in a transducer having a polarization and depth configuration as shown in FIG. 9.

Furthermore, the surface area of a single transducer may also be accurately controlled. This allows multiple transducers, each with its own phase and depth characteristics to be configured within a single piezoelectric transducer element. Referring to FIG. 10, an element is shown with three area configurations. Thus, leads 62—62 are attached to opposing faces of a rectangular transducer, leads 61—61 are attached to opposing faces of a squarish-shaped transducer, and leads 60—60 are likewise mounted with a circular transducer. All three transducers have individual configurations of depth and phase of various layers through the element, and all three transducers located within a single homogeneous element. Significant design flexibility results from this control over depth and volume polarization of piezoelectric elements.

Thus, any combination of polarization phase, either in one direction or the other, or depolarized, and depth as well as area of a particular phase of polarization, may be accomplished in a single homogeneous transducer element, utilizing the techniques described above. Any configuration of multimorph transducer may therefore be produced without the use of discrete, sandwiched construction.

Figure 2:
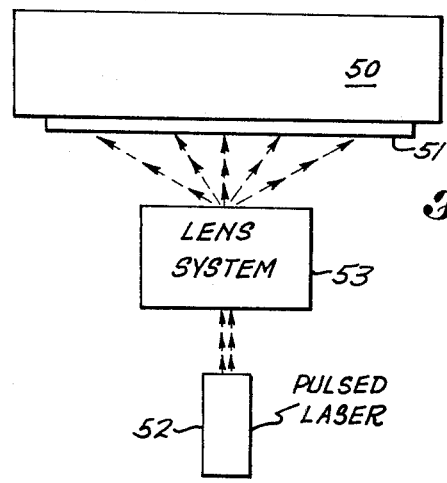
FIG. 2 shows a system for selectively heating one side of a transducer element by means of a laser apparatus.

The laser system of pulsed heating shown in FIG. 2 is of special interest because of the preciseness by which the heat pulses may be controlled. The laser system may either be a shuttered CW energy system, or a standard pulse laser. Typically, a pulsed laser 52 is utilized in conjunction with a lens system 53 to achieve a selected application of heat to the desired surface of the transducer element 50 through an electrode 51. This distribution can also be accomplished by stroboscopic manipulation. The distribution of the heat, of course, depends upon the configuration of the lens system. For instance, depending upon the shape of the transducer element, and the heat pattern desired in a particular application, the lens system may be used to evenly spread or disburse the laser heat over an extended area on the surface of the electrode 51, or it may be utilized to further focus the pulsed laser energy so that very small, discrete areas, lines, or geometric patterns of polarization may be achieved.

Referring now to FIGS. 3 through 7 the response of a transducer having various simple polarized-depolarized depth combinations will be examined and explained, so as to explain the monitoring technique of the present invention. The principles of the monitoring technique, although explained with respect to rather simple polarized layer configurations, are of course equally applicable to the multimorph configurations made possible by means of the techniques previously explained.

During the application of the thermal pulses from source 21, pulse generator 17 in conjunction with capacitor 18 continuously applies electrical pulses to the element, and the oscilloscope 20 displays the response of the element to those pulses.

The response of the element as shown by the scope 20 is in real time and is dependent upon the depth and phase of the polarization of successive layers in the element. The amplitude of the response is a function of the percentage of polarization, and the location of the response pulses, relative in time to the excitation pulse, is a function of the period of the excitation signal and the phase and depth of the polarization in the element. Thus, various polarization configurations of piezoelectric transducers may be accurately fabricated, because they may be accurately and continuously monitored during the process of fabrication, and the application of the bias voltage and pulsed heating controlled accordingly.

Figure 3:
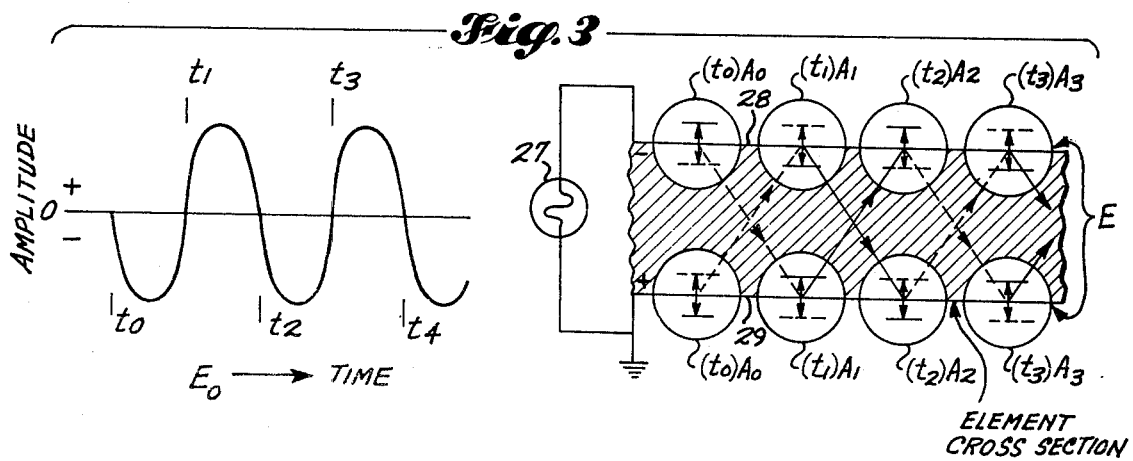
FIG. 3 shows the response of a completely polarized transducer to a sinusoidal excitation signal.

Referring to FIG. 3, a completely polarized transducer element 26 is shown having a source of electrical excitation 27, connected between opposing surfaces 28 and 29 of the element 26. The excitation is a continuous sinusoidal wave having a period $t_0-t_2$, the period of the waveform being related to the period of the element such that the element is ordinarily in resonance. The dotted lines in the element 26 refer to tension type waves which tend to expand the element, and the solid lines refer to compression type waves which tend to push the element in upon itself. The circled portions $A_0$, $A_1$, $A_2$ and $A_3$ refer to the excitation wave $A_0$ and the subsequent reflected wave pattern within the transducer at its two surfaces.

According to standard transducer theory, when a piezoelectric element is excited by such an electrical signal, a mechanical wave of a compression nature will be imparted at the boundaries or surfaces of the element, shown as $A_0$ in FIG. 3. This compression wave is transmitted through the element to the opposing surface, as shown, and then propagated or coupled through the boundary to the adjoining medium. At the polarized surfaces or boundaries of the element, however, a tension wave is reflected back into the element, since sound reflecting from a boundary of high-low acoustic impedance will be reversed in phase from the phase of the propagating wave. It is this initial reflected wave which is used to advantage in monitoring the polarization configuration of the element.

These alternating compression and tension reflected waves continue as long as there is excitation or until they die out due to natural or other damping. The transducer is thus said to "ring out" at its natural frequency. Thus, a completely polarized transducer element as shown in FIG. 3 can be detected by the monitoring device shown in FIG. 1 by observing on the oscilloscope this ringing response of the element. A continuously sinusoidal excitation signal will result in a sinusoidal ringing response by the element, the period of the response being determined by the natural period of the element.

Figure 4:
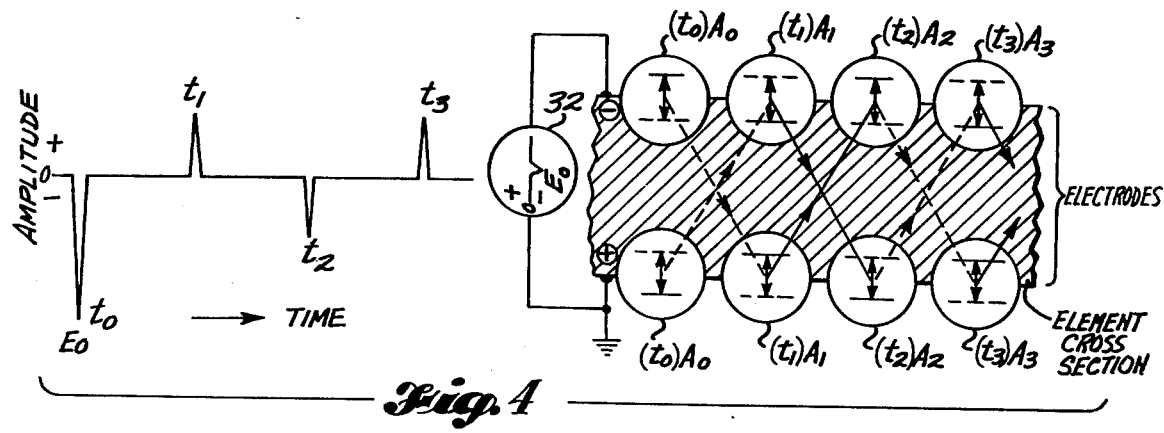
FIG. 4 shows the response of a completely polarized transducer element to a single electrical pulse.

Referring to FIG. 4, an identical transducer element 31, which is completely polarized in the cross-sectional view shown, is excited by a single pulse 32 of amplitude $E_0$ at time $t_0$. The response of the transducer, being fully polarized, is similar to that of the response to the sinusoidal signal. The initial pulse at $t_0$ will cause the transducer to respond with a mechanical wave, a compression wave being coupled to the adjoining medium, and a tension wave being reflected back into the transducer element, as shown by the dotted lines from $t_0$. The tension wave reaches the opposing surface of the element at time $t_1$, at which point the tension wave is coupled away from the elements, and a compression wave is reflected back into the element, as shown by the solid line beginning at $t_1$. This ringing response, caused by the excitation of the single electrical pulse shown, will continue until it naturally dampens out. The period from $t_0$ through $t_1$, which is the time which the wave takes to proceed from surface to surface, is equal to the natural period of the transducer element, as determined by the velocity of wave, and the thickness of the element.

Figure 5:
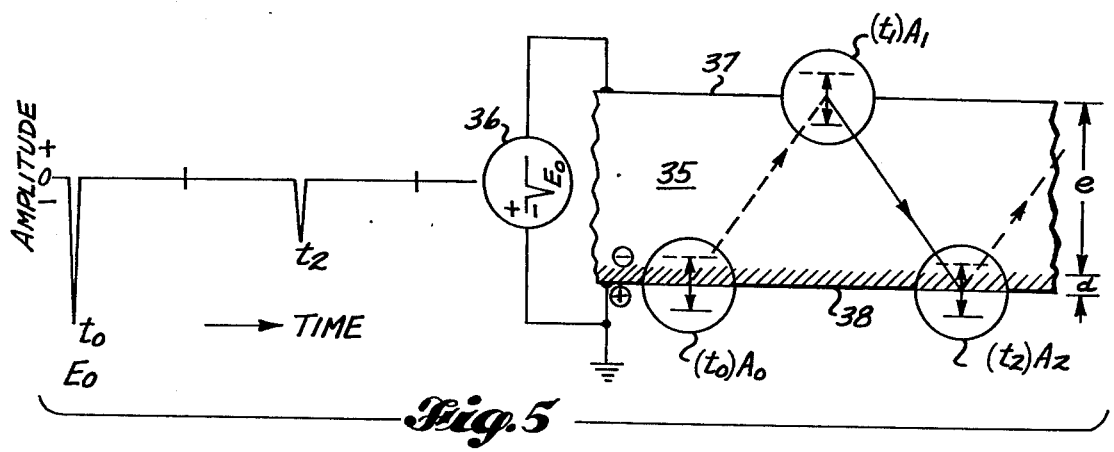
FIG. 5 shows the response of a thin strip partially polarized transducer element with respect to a single electrical pulse excitation signal, where the excitation waveform has a period greater than the polarized layer period.

Referring to FIG. 5, a transducer element is shown having a thin polarized portion d with respect to an unpolarized portion e in the cross-sectional dimension. This configuration may be produced by selective pulsed heating of one surface, while maintaining a short circuit to ground between the electrodes on the opposing surfaces.

When the transducer element 35 is depolarized sufficiently so that only a thin strip d remains with respect to the unpolarized portion e, a very different transducer response from that of FIG. 4, showing a natural damping effect, results. A single electrical pulse of amplitude $E_0$ is again applied by a pulse generator 36 to the opposing surfaces of a transducer element 35, as shown in FIG. 5. The time period of the excitation waveform is greater than the period of the polarized layer. Because one surface 37 of the transducer element is completely depolarized, no initial pulse $A_0$ is seen at the surface. The initial pulse $A_0$ is present only at the polarized surface 38. A compression wave is coupled to the medium adjoining the transducer element, and a tension wave is reflected back into the element 35, as shown by the dotted lines beginning at time $t_0$. At back surface 37, a compression wave will be reflected at time $t_1$ back into the element to the opposing surface. Although the wave is reflected, no response of the transducer is seen by the monitor at this point, due to the surface being nonpolarized.

At surface 38, a portion of the wave will be coupled away, while a tensional wave will be reflected back to the other surface, as shown. Since surface 38 is polarized, a response will be present at time $t_2$ which is the reflected portion of the tension wave originating from surface 38 at time $t_0$ and reflected by surface 37 at time $t_1$. This response of surface 38 will continue until the wave is completely damped out. However, it can be seen that the ringing response of the transducer element shown in FIG. 4 is significantly reduced, as spikes at time $t_1$ and $t_3$ are entirely eliminated, due to the substantial depolarization of the element in the cross-sectional dimension.

Figure 6:
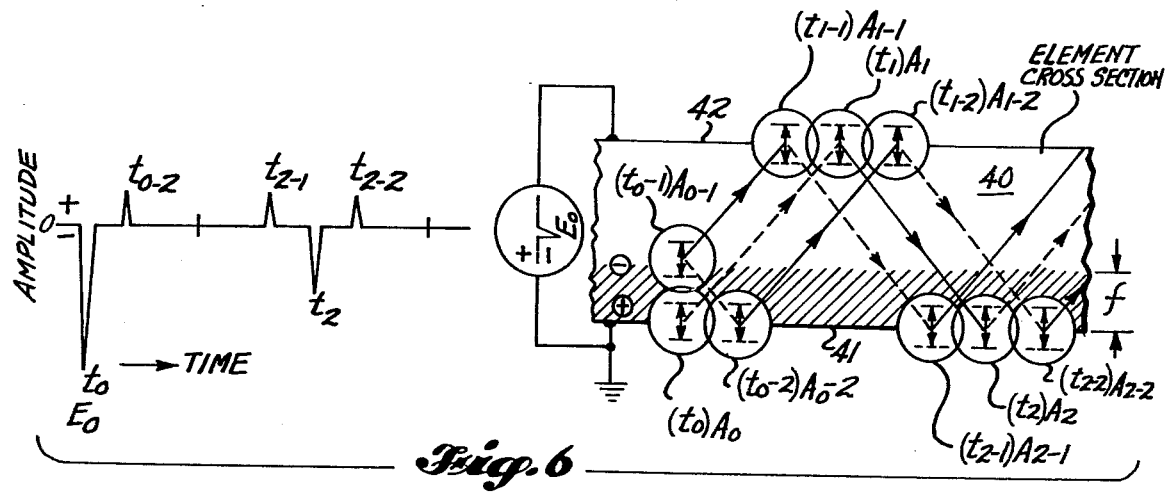
FIG. 6 shows the response of a thick partially polarized transducer element with respect to a single electrical pulse excitation signal, where the excitation period is less than one-half of the polarized layer period.

Referring to FIG. 6, a transducer element 40 partially polarized in the cross-sectional dimension is again shown, although the polarized portion f is thick with respect to the duration of the pulse which is used to excite the element. Since the thickness of the polarized portion is long with respect to the pulse duration of the excitation pulse, multiple reflections take place at the various interfaces between the polarized portion and the unpolarized portion and at the element surfaces 41 and 42.

When the transducer element is excited by a pulse of amplitude $E_0$, and the period of the excitation wave is less than one-half of the period of the polarized layer, the element will respond with a mechanical wave from both faces of the polarized portion, sending a compression wave to the coupling medium, and reflecting a tension wave back into the element. This is shown at ($t_0$) $A_0$, and ($t_0$) $A_{0\text{-}1}$. Multiple reflections then take place off of the back surface 42 of the element, and surface 41. These waves will continue to reflect off both surfaces 41 and 42, creating a complex response as shown of compression and tension waves.

A transducer response will be noted whenever a wave, either compression or tension, reaches the polarized surface 41 of the transducer element. Therefore, at times $t_0$, $t_{0\text{-}2}$, $t_{2\text{-}1}$, $t_2$ and $t_{2\text{-}2}$, a response of the transducer will be noted. This conforms to the response diagram shown at the left in FIG. 6, where $t_0$ is the time of the excitation wave, and $t_2$ is the time of the reflected response from surface 42. The other spikes shown at $t_{0\text{-}2}$, $t_{2\text{-}1}$, and $t_{2\text{-}2}$ are the result of waves originating from the inner boundary 43 of the polarized portion or the element.

Thus, responses at surface 41 due to both the back surface 42 and the inner boundary 43 are observed, and the measure of time between the two responses, i.e., $t_{2\text{-}1}$ and $t_2$ is a function of the thickness of the polarized layer. The depth of polarized layers may thus be accurately controlled by controlling the period of the excitation wave, and viewing the response of the element to the excitation pulses. When a proper time relationship is observed, the pulsed heating may be terminated, and the next step begun.

FIG. 7 shows a transducer element 45 which is polarized in two directions, that is, one-half of the cross-sectional dimension $h$ is polarized in one dipole direction, while the other portion $j$ of the transducer is polarized in the opposite direction. This results in a dual polarized element with a response to a triangle pulse of amplitude $E_0$ similar to that shown in FIG. 7. In this case, since the polarized layers are each equal to one-half the element thickness, and since they are oppositely polarized, the response noted at the element surface will be in terms of signal pulses of the same polarity as the excitation pulse, occurring with a frequency shown in FIG. 7.

The foregoing examples demonstrate that the response of the transducer, as recorded on the oscilloscope, is dependent upon the phase and depth of the polarization of individual layers of a single transducer element. Furthermore, by interrogating transducers with pulses of varying period with respect to the period of individual polarized layers, a continuous, and in many cases real time, monitor can be maintained on the polarization and volume of successive layers in the transducer, as those layers are being developed within the homogeneous element by the methods described earlier and more fully covered in copending application referred to above.

Various desired controlled volume and phase polarization configurations thus may be obtained by monitoring each phase of the construction of the transducer and terminating individual steps when the desired response is observed on the oscilloscope. By thus utilizing the pulsed heating technique and the monitoring technique, accurate complex multimorph structures may be constructed from a single homogeneous piezoelectric element.

Although a preferred embodiment of the invention has been disclosed herein for purposes of illustration, it should be understood that various changes, modifications and substitutions may be incorporated in such embodiment without departing from the spirit of the invention as defined by the claims which follows:

I claim:

1. A method for controlling the polarization condition of a ferroelectric element as the polarization condition is altered from an initial polarization condition to a selected polarization condition, the ferroelectric element having a known response to applied electrical signals at the selected polarization condition, and having first and second generally opposed surfaces with a peripheral surface therebetween, comprising the steps of:

altering the initial polarization condition of a portion of the ferroelectric element, said portion extending from the first opposed surface inwardly of the ferroelectric element;

applying an electrical signal to at least one of the first and second opposed surfaces of the ferroelectric element;

sensing an electrical response of the ferroelectric element of at least one of the first and second opposed surfaces to said applied electrical signal;

comparing the sensed electrical response with the known response; and repeating said steps of altering, applying, sensing and comparing for successive portions of the ferroelectric element inwardly thereof until said sensed electrical response is substantially identical with the known response.

2. A method of claim 10, wherein the step of altering includes the step of applying a series of thermal pulse to said first opposed ferroelectric element surface.

3. A method of claim 1, wherein the step of applying includes coupling said electrical signal to the first and second opposed surfaces through an electrode in contact with said first and second opposed surfaces.

4. A method of claim 1, wherein the selected polarization condition of the ferroelectric element includes a plurality of element regions of differing depth and phase polarization wherein said element regions are spaced successively between the two opposed surfaces, and wherein said step of altering, applying, sensing, comparing, and repeating are accomplished for each of said plurality of element regions.

5. A method of claim 1, wherein the ferroelectric element in said predetermined polarization condition includes a plurality of element regions between said first and second opposed surfaces, at least one of said regions being polarized and having a natural period equal to an amount of time for an acoustic wave to travel through said one region in a direction between said first and second opposed surfaces, and wherein the applied electrical signals have a time duration no greater than one-half of said natural period of said one polarized region.

6. A method of claim 1, wherein the step of sensing provides a visual indication of the sensed response of the ferroelectric element to said applied signals.

7. A method of claim 6, wherein the visual indication of the sensed response is provided by an oscilloscope.

8. A method of claim 1, wherein said applied electrical signals are applied to said first and second opposed surfaces during the step of altering.

9. A method of claim 8, wherein the step of altering includes the step of applying a series of thermal pulses to said first opposed surface.

10. A method of claim 8, wherein said applied electrical signals are applied at a sufficiently high rate during the step of altering such that any change in the response of the ferroelectric element to the step of altering is detectable.

11. A method of claim 8, wherein the step of applying includes coupling said electrical signals to said first and second opposed surfaces through an electrode contacting each of said first and second opposed surfaces.

12. AS method of claim 8, wherein the predetermined polarization condition of the ferroelectric element includes a plurality of element regions of differing depth and phase polarization, which regions are spaced successively between the first and second opposed surfaces and wherein said steps of altering, applying, sensing, comparing and repeating are accomplished for each said element region.

13. A method of claim 8, wherein the ferroelectric element in said predetermined ferroelectric condition includes a plurality of element regions between the first and second opposed surfaces, at least one of said element regions being polarized and having a natural period equal to an amount of time for an acoustic wave to travel through said one region in a direction between said first and second opposed surfaces and wherein the said applied electrical signals have a time duration no greater than one-half of said natural period of said one polarized region.

* * * * *